United States Patent [19]

Kinghorn

[11] Patent Number: 4,574,386

[45] Date of Patent: Mar. 4, 1986

[54] DYNAMICALLY OPERABLE TWO-PHASE LOGIC CIRCUITS

[75] Inventor: John R. Kinghorn, Sutton, England

[73] Assignee: U.S. Philips Corporation, New York, N.Y.

[21] Appl. No.: 491,510

[22] Filed: May 4, 1983

[30] Foreign Application Priority Data

May 12, 1982 [GB] United Kingdom ................ 8213749

[51] Int. Cl.$^4$ ............................................ H03K 23/44
[52] U.S. Cl. .................................... 377/121; 307/453; 307/481; 307/605; 377/105; 377/111
[58] Field of Search ............... 307/443, 453, 468, 481, 307/269, 594, 596, 605, 608; 377/33, 105, 111, 114, 118, 121

[56] References Cited

U.S. PATENT DOCUMENTS

| | | | |
|---|---|---|---|
| 3,621,280 | 11/1971 | Ma .......................................... | 377/105 |
| 3,965,369 | 6/1976 | Hatsukano ........................ | 307/453 X |
| 3,983,411 | 9/1976 | Luscher et al. ...................... | 377/105 |
| 4,178,520 | 12/1979 | Rusznyak ............................ | 377/121 |
| 4,356,413 | 10/1982 | Rosenbluth et al. ................ | 307/443 |
| 4,371,795 | 2/1983 | Mulder et al. .................... | 307/453 X |
| 4,415,819 | 11/1983 | Mathes ............................ | 307/453 X |

OTHER PUBLICATIONS

Riley, "Counter Circuit", IBM Tech Disc Bull, vol. 3, No. 10, Mar. 1961, pp. 51–52.

Primary Examiner—Stanley D. Miller
Assistant Examiner—D. R. Hudspeth
Attorney, Agent, or Firm—Robert T. Mayer; Steven R. Biren

[57] ABSTRACT

A dynamic two-phase circuit arrangement includes two dynamic switching circuits, each of which has an input stage, a non-inverting output stage and an inverting output stage. Two-phase control of the two dynamic switching circuits is effected by two drive pulses. The arrangement also includes combinatorial logic which is operated by the drive pulses to feed counter clock pulses to the first dynamic switching circuit. The first dynamic switching circuit performs a divide-by-two operation in response to the clock pulses and drives the second dynamic switching circuit from its Q-output. The second dynamic switching circuit includes an additional switching transistor which is also driven from the Q-output of the first dynamic switching circuit. This transistor is connected to perform an OR-function with the non-inverting output stage of the second dynamic switching circuit. As a result, this output stage produces shift pulses having half the repetition frequency of the clock pulses. The duration of these shift pulses corresponds to the period of the two-phase control cycle of the arrangement.

6 Claims, 12 Drawing Figures

DYNAMICALLY OPERABLE TWO-PHASE LOGIC CIRCUITS

BACKGROUND OF THE INVENTION

This invention relates to circuit arrangements which can be implemented as integrated circuits that include what will be termed an "array logic structure".

For the purposes of the present specification an "array logic structure" is heredefined as a plurality of controllable insulated gate field effect transistors which are formed at selected intersections of an array consisting of a plurality of rows of series-connected gate regions and a plurality of columns of surface regions which at each selected intersection define source and drain regions for the transistor which is formed there, an electrical path being formed at each other (non-selected) intersection, at least in use of the structure, to effectively short circuit the intersection with respect to the relevant surface region column.

In one known form of this array logic structure, the controllable transistors at the selected intersections are formed as n-channel IGFETS of the enchancement type, and at the non-selected intersections there are formed n-channel IGFETS of the depletion type to provide the electrical paths which short-circuit (or bridge) these latter intersections in the direction of the relevant surface region column. Further information concerning such an array logic structure can be found in our United Kingdom patent specification No. 1,575,741, which corresponds to U.S. Pat. No. 4,336,452.

An array logic structure as defined above can be used to implement so-called combinatorial logic circuits (that is, circuits which can perform combinations of logic functions such as AND and OR functions) which are for use synchronously with dynamic circuits and which can be implemented in the same integrated circuit structure as the dynamic circuits. A known dynamic circuit which can be used as a binary stage for a known construction of binary counter is a two-phase dynamic D-type flip-flop. A plurality of these flip-flops are interconnected using synchronous combinatorial logic circuits implemented in an array logic structure to form the counter. However, the size of array logic structure which is necessary for the combinatorial logic circuits that are required to interconnect the flip-flops to form a counter having more than four stages, is so large as to be wasteful of chip area. Furthermore, these logic circuits may be unacceptably slow in operation because of the size of the structure. In fact, the size of the array logic structure increases non-linearly as the number of counter stages increases, so that this drawback increases in severity with increase in counter size.

In view of this drawback, it has hitherto been the practice, when a bit count is required whiqh is greater than that provided by such a binary counter having four stages, to use instead a pseudorandom ring counter whose stages are also formed by the known two-phase dynamic D-type flip-flops which are appropriately interconnected by combinatorial logic circuits. The normal maximum count of a pseudo-random ring counter is $(2^n-1)$, where n is the number of counter stages, and the counting sequence is not a natural binary counting sequence. The combinatorial logic circuits required for a pseudo-random ring counter which provides a given maximum count are far simpler than the combinatorial logic circuits required for a conventional binary counter which provides an equivalent maximum natural binary count. Therefore, when large bit counts are required, the use of an array logic structure to form the combinatorial logic circuits required for a pseudo-random ring counter can become acceptable as regards both chip area and operating speed.

However, in digital data systems, there are occasions when a natural binary counting sequence is essential, or at least desirable, for instance, when interfacing different equipments for the mutual transfer of data between them. If different binary counting sequences are used in such equipment, then translation of data transferred from one equipment to another may become necessary.

SUMMARY OF THE INVENTION

It is an object of the present invention to provide a circuit arrangement which can be implemented as an integrated circuit that includes an array logic structure, and which can be used to form a binary stage for a binary counter having a natural binary counting sequence. As will be described, the formation of such a binary counter using the circuit arrangement for each stage requires only a relatively small fixed amount of combinatorial logic as included in the circuit arrangement, so that the formation of large binary counters becomes possible without suffering the previously mentioned drawback to the same extent as the known construction of binary counter.

According to the invention, there is provided a dynamically operable two-phase circuit arrgngement comprising first and second flip-flop or dynamic switching circuits each of which has an input stage, a non-inverting output stage and an inverting output stage, each stage being responsive to either one of two possible logic levels at an input to produce the other logic level at an output, of which stages, the input stage has its input connected to receive an input logic level via a first transfer stage controlled by first drive clock pulses of one phase, the non-inverting output stage has its input connected to receive the output logic level of the input stage via a second transfer stage controlled by second drive clock pulses of another phase, and the inverting output stage has its input connected to receive the output logic level of the non-inverting output stage, which circuit arrangement further comprises a combinatorial logic circuit which is operable under two-phase control by said first and second drive clock pulses, and in response to applied counter clock pulses, to cause the first flip-flop circuit to perform a divide-by-two operation; and which circuit arrangement is characterized in that one of the output stages of the first flip-flop circuit has its output connected on the one hand to the input of the input stage of the second flip-flop circuit and connected on the other hand via a switching stage to the output of the corresponding output stage of the second flip-flop circuit, the arrangement being such that at said latter output shift pulses are produced having only one half the repetition frequency of the counter clock pulses.

In carrying out the invention, said switching stage may be arranged to be responsive to either one of said two possible logic levels at an input to produce the other logic level at an output, with said switching stage having its input connected to receive the prevailing logic level at the output of said one output stage of the first flip-flop circuit and having its output connected to the output of the corresponding output stage of the second flip-flop circuit to perform therewith an OR-function which determines the duration of said shift pulses.

The combinatorial logic circuit may comprise two 2-input AND-gates the outputs of which form respective inputs of a 2-input OR-gate, one of said AND-gates having one input connected to receive the applied counter clock pulses and other input connected to the output of the inverting output stage of the first flip-flop circuit, and the other of said AND-gates having one input connected to receive an inverted form of the applied counter clock pulses, and the other input connected to the output of the non-inverting output stage of the first flip-flop.

As implemented as an integrated circuit the combinatorial logic circuit would be formed as an array logic structure as hereinbefore defined.

A plurality of circuit arrangements according to the invention as set forth above can be interconnected to form respective stages of a conventional binary counter having a natural binary count, in which counter the circuit arrangement forming the first stage has its combinatorial logic circuit connection to receive applied counter clock pulses and the circuit arrangement forming each other stage has its combinatorial logic circuit connected to receive the shift pulses produced by the circuit arrangement forming the preceding stage.

A conventional binary counter which is formed in this way requires no additional combinatorial logic for interconnecting the counter stages. Therefore, the array logic structure of an integrated circuit in which the counter is implemented has only to cater to the relatively small amount of combinatorial logic in each circuit arrangement.

The natural binary count can be taken from the output of the non-inverting stage of the first flip-flop circuit in each circuit arrangement. For an n-stage counter, (n-1), (n-2), . . . (n-n) delay stages, respectively, may then be provided for delay equalization of the output logic levels of the 1 to n counter stages, the delay stage(s) being connected to the relevant non-inverting output stage of the circuit arrangement concerned and (each) providing a delay corresponding to one cycle of two-phase dynamic operation of the circuit arrangement.

BRIEF DESCRIPTION OF THE DRAWING

In order that the invention may be more fully understood reference will now be made by way of example to the accompanying drawing, of which.

DESCRIPTION OF THE PREFERRED EMBODIMENTS

Figure 1:
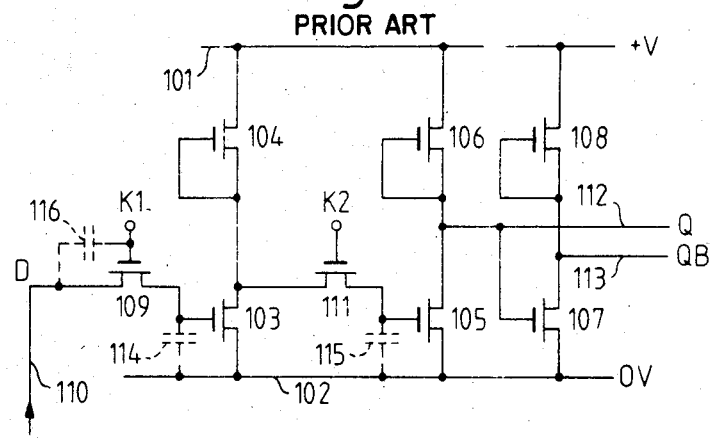
FIG. 1 is a circuit of a known form of two-phase dynamic D-type flip-flop.

Referring to the drawings, the flip-flop circuit shown in FIG. 1 comprises both enhancement and depletion type insulated gate field effect transistors and is assumed to be implemented as an integrated circuit using n-channel technology, with its upper supply line 101 being positive (+V) rail and its lower supply line 102 being at ground (OV). The flip-flop circuit has an input stage comprised by two transistors 103 and 104, a non-inverting output stage comprised by two transistors 105 and 106, and an inverting output stage comprised by two transistors 107 and 108. A first transfer transistor 109 is connected between a D-input and the input stage, and a second transfer transistor 111 is connected between the input stage and the output stage. The output stage provides a Q-output on an output lead 112 and the inverter output stage provided a QB-output on an output lead 113. The transistors 103, 105, 107, 109 and 111 are enhancement type IGFETS. The transistors 104, 106 and 108 are depletion type IGFETS and serve as loads for the transistors 103, 105 and 107, respectively.

Figure 9:
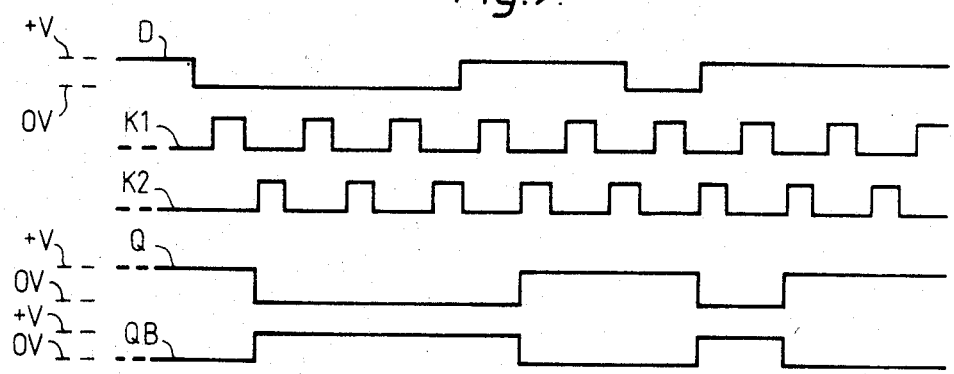
FIGS. 9 to 12 show idealized explanatory waveform diagrams.

The flip-flop circuit is driven by two clock pulses K1 and K2 of different phases which are applied respectively to the gates of the transfer transistors 109 and 111. Waveforms for these two clock pulses K1 and K2 are shown in FIG. 9, together with an exemplary data waveform D and resultant output waveforss Q and QB. In operation of the flip-flop circuit, the data waveform D, which is applied over a data input lead 110 to the D-input, assumes either a high (+V) logic level or a low (OV) logic level. On the occurrence of a clock pulse K1, the transfer transistor 109 is switched on and the prevailing logic level of the data waveform D is transferred to the gate of the transistor 103. At the end of the clock pulse K1, the transfer transistor 109 is switched off and the prevailing logic level is maintained at the gate of the transistor 103 by a capacitor 114. The transistor 103 is switched on, or remains switched off, according to whether the prevailing logic level of the data waveform D is the high logic level or the low logic level, to provide the alternate logic level at the junction of transistors 103/104. On the occurrence of the immediately following clock pulse K2, the transfer transistor 111 is switched on and said alternate logic level is transferred to the gate of the transistor 105. At the end of the clock pulse K2, the transfer transistor 111 is switched off and said alternate level is maintained at the gate of the transistor 105 by a capacitor 115. The transistor 105 is switched on, or remains switched off, according whether said alternate logic level is the high logic level or the low logic level, to provide at the Q output a logic level corresponding to the original logic level of the data waveform D. The transistor 107 has its gate connected to the junction of transistors 105/106 at which the Q output logic level is produced, and thus provides the alternate logic level for the QB output. A capacitor 116 is provided to compensate for possible degradation of the logic level of the data waveform D at the input of the flip-flop circuit. The capacitors 114, 115 and 116 are shown in dotted line, because it is possible that each can be dispensed with if the gate capacitance of the relevant transistor suffices to perform its function.

Figure 2:
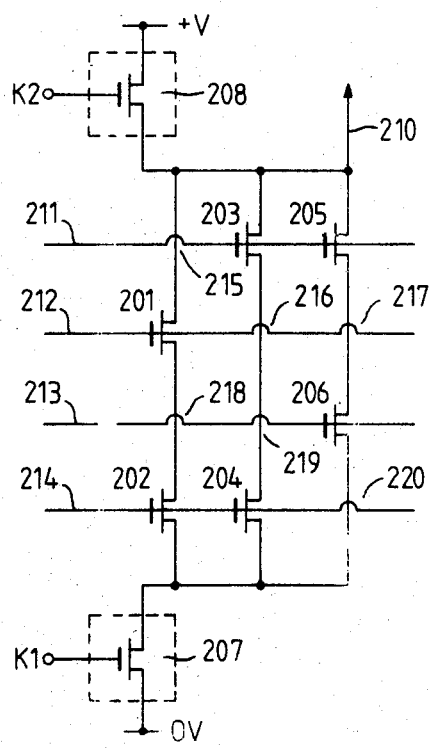
FIG. 2 is a circuit of typical known combinatorial logic which can be used to drive the flip-flop of FIG. 1.

FIG. 2 shows a typical combinatorial logic circuit which can provide the data waveform D on an output lead 210. This logic circuit comprises six transistors 201 to 206 connected between two drive transistors 207 and 208 across the supply lines (+V), (OV). Each of the three pairs of transistors 201/202, 203/204 and 205/206 form a 2-input AND-gate, and the overall logic circuit forms a 3-input OR-gate. The clock pulses K1 and K2 are applied to the gates of the transistors 207 and 208, respectively. Four control leads 211 to 214 are selectively connected to the gates of the transistors 201 to 206 in the configuration shown.

In operation of the combinatorial logic circuit, with the leads 110 and 210 interconnected, the occurrence of a clock pulse K2 switches on transistor 208 for the period of this pulse and capacitor 116 (FIG. 1) is precharged to the high logic level. On the occurrence of the immediately following clock pulse K1, transistor 207 is switched on, by which time transistor 208 will be switched off again.

If both the transistors in any of the three pairs 201/202, 203/204 and 205/206 are receiving high logic levels at their gates from the relevant control leads and are therefore switched on (i.e. the AND-gate they form is enabled), then with transistor 207 switched on, the capacitor 116 will discharge through the logic circuit to the low logic level, which logic level will be transferred by the transfer transistor 109 to the capacitor 114. If no discharge path is established through the logic circuit when the clock pulse K1 occurs, then the capacitor 116 will retain the high logic level which instead will be transferred by the transistor 109 to the capacitor 114.

As implemented by an array logic structure, the transistors 201 to 206 can be enhancement type IGFETS. At each of the intersections 215 to 220 in the array, where the two crossover leads are electrically insulated from each other, depletion type IGFETS can be used to form the intersection.

Figure 3:
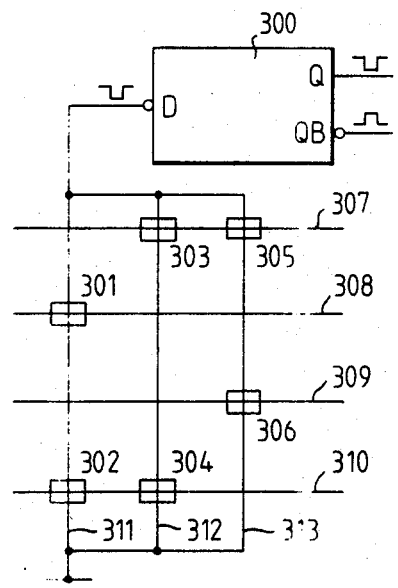
FIG. 3 is a schematic diagram representing the flip-flop of FIG. 1 and the logic of FIG. 2.

A convenient way of illustrating the flip-flop circuit of FIG. 1 and the combinatorial logic circuit of FIG. 2 is to use a schematic diagram of the form shown in FIG. 3. In this schematic diagram, the rectangle 300 represents the flip-flop circuit. Because the flip-flop circuit receives a low logic level in response to gated high logic levels on the control leads of the logic circuit, the D-input is given an "inverter" circle to signify that the low logic level corresponds to the binary 1 input signal. The "inverter" circle at the QB output signifies that a (high logic level) binary 1 output signal is taken from the QB output in response to a binary 1 (low logic level) input signal. The binary 0 output signal at the Q output then corresponds to the low logic level. The controlled transistors in the logic circuit are represented by the small rectangles 301 to 306, respectively. At each intersection of the logic circuit where no controlled transistor is provided, electrical isolation between the two crossover leads is assumed. These crossover leads are considered as a set of control leads 307 to 310 and a set of drive leads 311 to 313. The transistors located along a drive lead form inputs of an AND-gate and are considered to be "enabled" and "inhibited", respectively, in response to high and low logic levels, respectively, on the relevant control lead. Thus, two appropriately-gated high logic levels on two of the four control leads 307 to 310 will result in a low logic level at the D-input, which produces a binary 1 output signal at the QB output and a binary 0 signal at the Q output. The two-phase action of the pulses K1 and K2 is assumed to be implicit in the operation. This convention is also used in other Figures to be considered.

Figure 4:
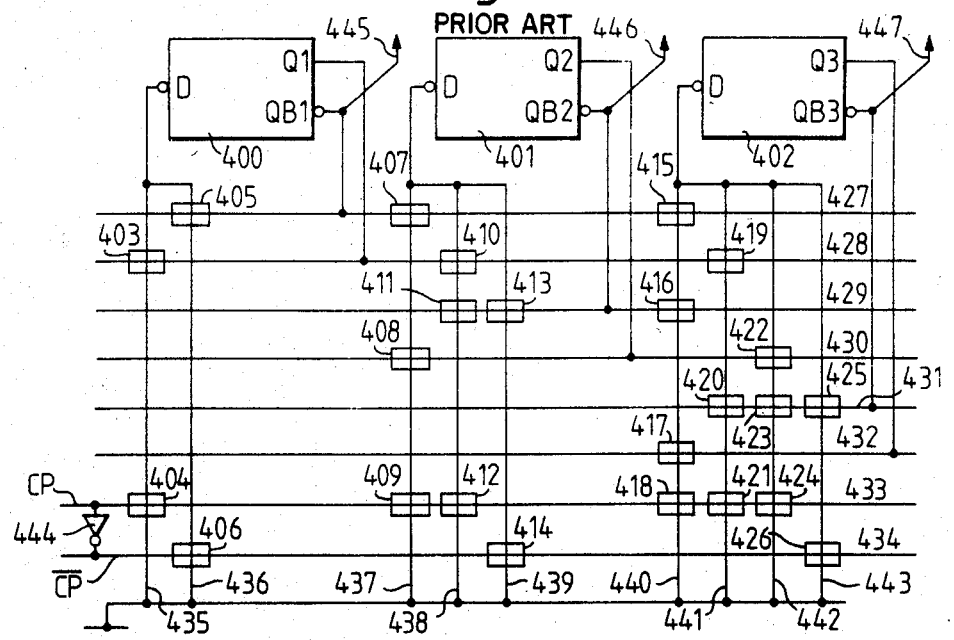
FIG. 4 is a schematic diagram of a known 3-stage binary counter comprising three flip-flops interconnected by appropriate combinatorial logic.

FIG. 4 is a schematic diagram which uses the above convention to illustrate a 3-stage conventional binary counter. This counter comprises three flip-flops 400, 401 and 402 and associated combinatorial logic composed of twenty-four controlled transistors 403 to 426, a set of control leads 427 to 434, and a set of drive leads 435 to 443. The counter is driven by counter clock pulses CP applied to the control lead 433, and inverted clock pulses $\overline{CP}$, as produced by an inverter 444, are applied to the control lead 434. These inverted clock pulses $\overline{CP}$ provide a "hold" action during the second half of each two-phase cycle of operation of the clock pulses K1, K2. The other control leads are grouped in pairs 427/428, 429/430 and 431/432, which have the QB output and the Q output (QB1, Q1; QB2, Q2; QB3, Q3) of the flip-flops 400 to 402 respectively connected to them.

Figure 10:
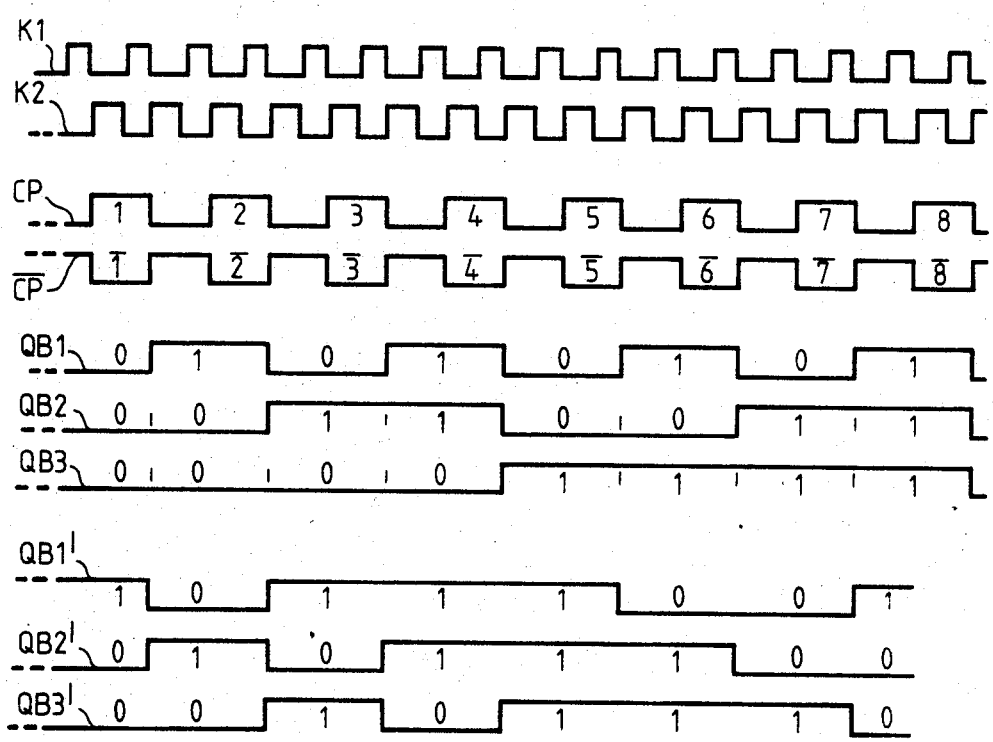

The counter of FIG. 4 provides a natural binary count on three output leads 445 to 447, and operates as follows, reference also being made to FIG. 10 which shows in idealized form the counter clock pulses CP and $\overline{CP}$, and some binary 1 and 0 signals at the QB outputs QB1 to QB3. Drive clock pulses K1 and K2 having a suitable relationship with the counter clock pulses CP are also shown in FIG. 10. The natural binary counting sequence is given in the following TABLE I, together with a list of which AND-gates are open at each step in the counting sequence as a consequence of the inhibit and enable effects of the logic levels at the QB and Q outputs, as also given in this TABLE I.

TABLE I

| inhibit transistors | enable transistors |
|---|---|
| QB1 = 0  405, 407, 415 | Q1 = 1  403, 410, 419 |
| QB2 = 0  411, 413, 416 | Q2 = 1  408, 422 |
| QB3 = 0  420, 423, 425 | Q3 = 1  417 |
| Q1 = 0  403, 410, 419 | QB1 = 1  405, 407, 415 |
| Q2 = 0  408, 422 | QB2 = 1  411, 413, 416 |
| Q3 = 0  417 | QB3 = 1  420, 423, 425 |

| Clock Pulses | | binary count | | | AND-gate(s) open |
|---|---|---|---|---|---|
| | | QB3 | QB2 | QB1 | |
| CP1 (count) | 0 | 0 | 0 | 0 | 403/404 |
| CP1 (hold) | | 0 | 0 | 1 | 405/406 |
| | 1 | | | | |
| CP2 (count) | | 0 | 0 | 1 | 407/408/409 |
| CP2 (hold) | | 0 | 1 | 0 | 413/414 |
| | 2 | | | | |
| CP3 (count) | | 0 | 1 | 0 | 403/404 |
| $\overline{CP3}$ (hold) | | 0 | 1 | 1 | 405/406, 413/414 |
| | 3 | | | | |
| CP4 (count) | | 0 | 1 | 1 | 415/416/417/418 |
| $\overline{CP4}$ (hold) | | 1 | 0 | 0 | 425/426 |
| | 4 | | | | |
| CP5 (count) | | 1 | 0 | 0 | 403/404, 419/420/421 |
| $\overline{CP5}$ (hold) | | 1 | 0 | 1 | 405/406, 425/426 |
| | 5 | | | | |
| CP6 (count) | | 1 | 0 | 1 | 407/408/409, 422/423/424 |
| $\overline{CP6}$ (hold) | | 1 | 1 | 0 | 425/426, 413/414 |
| | 6 | | | | |
| CP7 (count) | | 1 | 1 | 0 | 403/404, 410/411/412, 419/420/421 |
| $\overline{CP7}$ (hold) | | 1 | 1 | 1 | 405/406, 413/414, 425/426 |
| | 7 | | | | |
| CP8 (count) | | 1 | 1 | 1 | NIL |
| $\overline{CP8}$ (hold) | 0 | 0 | 0 | 0 | NIL |

With reference to TABLE I, it can be seen, in general, that when a flip-flop is to provide a QB=1 output in response to the next clock pulse CP, its existing Q=1 output is enabling one transistor of the relevant AND-gate, and as the change (except for flip-flop 400) is conditional on the state of at least one of the other flip-flops, then at least one other transistor in the AND-gate is being enabled by either a Q=1 or QB=1 output from that other flip-flop. Once the QB=1 output has been produced it is held by the following $\overline{CP}$ pulse by an AND-gate having one transistor enabled by the QB=1 output from the flip-flop.

As one specific example, assume the binary counter is producing the binary count 101. When the next clock pulse CP6 occurs, flip-flop 400 is changed to QB1=0 because its single drive AND-gate 403/404 is closed since transistor 403 is inhibited by Q1=0 output. Flip-flop 401 is changed to QB2=1 output because AND-gate 407/408/409 is open, transistor 407 being enabled by QB1=1 output and transistor 408 being enabled by Q2=1 output. Flip-flop 402 is re-driven to keep its QB3=1 output because AND-gate 422/423/424 is open, transistor 422 being enabled by Q2=1 output and transistor 423 being enabled by QB3=1 output. When the following clock pulse $\overline{CP}$6 occurs, AND-gates 425/426 and 413/414 are open to hold the count at 110 until the next clock pulse CP.

Figure 5:
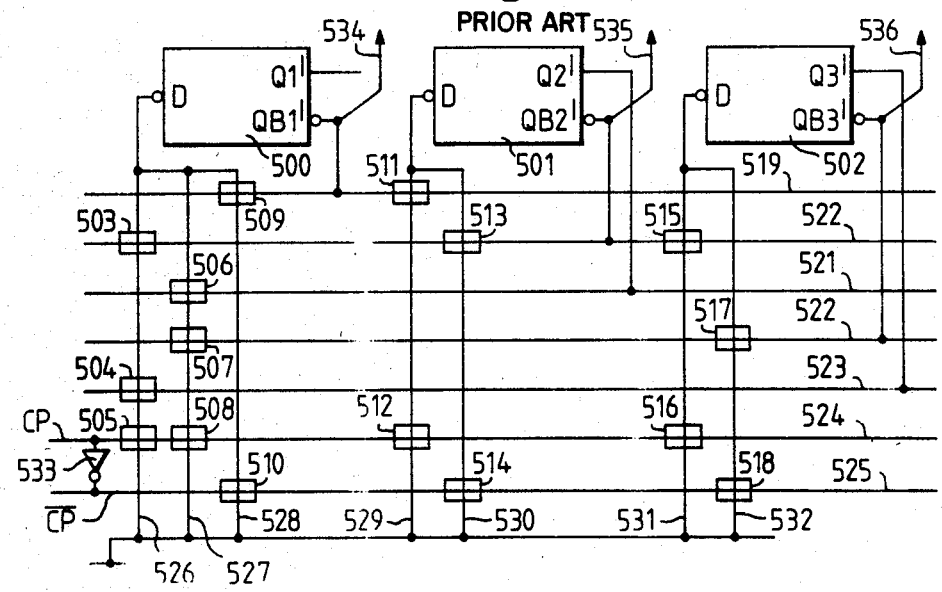
FIG. 5 is a schematic diagram of a known 3-stage pseudo-random ring counter comprising three flip-flops interconnected by appropriate combinatorial logic.

A conventional binary counter of the form shown in FIG. 4 which has a natural binary counting sequence requires two control (horizontal) leads for each binary stage, plus a further two for the clock pulse toggle CP/$\overline{CP}$, and it requires n+1 drive leads for each binary stage, where n is the stage number (i.e. the 3rd stage 402 requires four drive leads). Because of these requirements there exists the drawback that the use of an array logic structure to implement the combinatorial logic for a large counter can become impractical. For instance, a six stage counter would require (6×2)+2=14 control leads and 7+6+5+4+3+2=27 drive leads. The array logic structure could therefore require 27×14=378 transistors for its implementation.

Where a natural binary count is unnecessary, the above drawback can be alleviated by providing a pseudo-random ring counter as will now be considered with reference to FIG. 5. The counter in FIG. 5 comprises three flip-flops 500, 501 and 502 and associated combinatorial logic comprised of sixteen controlled transistors 503 to 518, a set of control leads 519 to 525, and a set of drive leads 526 to 532. The counter is driven by clock pulses CP applied to the control lead 524, and inverted clock pulses $\overline{CP}$, as produced by an inverter 533, are applied to the control lead 525. The QB'-outputs and the Q'-outputs are connected to the other control leads 519 to 523 in such a configuration that the counter provides on output leads 534 to 536 a pseudo-random recurrent binary count of seven as set forth in TABLE II below, which table also gives a list of which AND-gates are open at each step in the counting sequence as a consequence of the inhibit and enabling effects of the QB'-outputs and Q'-outputs as also given in this TABLE II. Binary 1 and 0 signals at the QB'-outputs are shown in FIG. 10.

TABLE II

| inhibit transistors | enable transistors |
|---|---|
| QB1' = 0 509, 511 | Q1' = 1 NIL |
| QB2' = 0 503, 513, 515 | Q2' = 1 506 |
| QB3' = 0 507, 517 | Q3' = 1 504 |
| Q1' = 0 NIL | QB1' = 1 509, 511 |
| Q2' = 0 506 | QB2' = 1 503, 513, 515 |

TABLE II-continued

| Q3' = 0 504 | | | QB3' = 1 507, 517 |
|---|---|---|---|
| Clock Pulses | QB3' | QB2' | QB1' | AND-gates open |
| CP1 | 0 | 0 | 1 | 511/512 |
| $\overline{CP}$1 | 0 | 1 | 0 | 513/514 |
| CP2 | 0 | 1 | 0 | 503/504/505, 515/516 |
| $\overline{CP}$2 | 1 | 0 | 1 | 509/510, 517/518 |
| CP3 | 1 | 0 | 1 | 506/507/508, 511/512 |
| $\overline{CP}$3 | 0 | 1 | 1 | 509/510, 513/514 |
| CP4 | 0 | 1 | 1 | 503/504/505, 511/512, 515/516 |
| $\overline{CP}$4 | 1 | 1 | 1 | 509/510, 513/514, 517/518 |
| CP5 | 1 | 1 | 1 | 511/512, 515/516 |
| $\overline{CP}$5 | 1 | 1 | 0 | 513/514, 517/518 |
| CP6 | 1 | 1 | 0 | 515/516 |
| $\overline{CP}$6 | 1 | 0 | 0 | 517/518 |
| CP7 | 1 | 0 | 0 | 506/507/508 |
| $\overline{CP}$7 | 0 | 0 | 1 | 509/510 |

It can be seen by comparison of FIGS. 4 and 5 that using a pseudo-random ring counter instead of a conventional binary counter for large counters can afford a significant saving in the size of the array logic structure which is required, but at the expense of not having a natural binary counting sequence. Also, there are limitations in the speed of the system clock (i.e. the clock pulses K1 and K2) in the case of a large conventional binary conuter.

A circuit arrangement according to the invention provides a solution for occasions when a natural binary count is essential. This circuit arrangement employs synchronous dynamic logic and can be used to form the stages of a conventional binary counter, but without the speed limitations of an equivalent conventional binary counter. As will be seen, more active devices are used for the circuit arrangement, compared with each (flip-flop) stage of a conventional binary counter employing synchronous dynamic logic as already described, but the use of only a small amount of combinatorial logic and thus only a relatively small array logic structure is necessary in a circuit arrangement according to the invention; furthermore no additional combinatorial logic is required for interconnecting a number of arrangements to form a counter. Thus, there need not be any increase in chip area in forming a counter as an integrated circuit layout for it can be more compact with simpler interconnections between stages.

Figure 6:
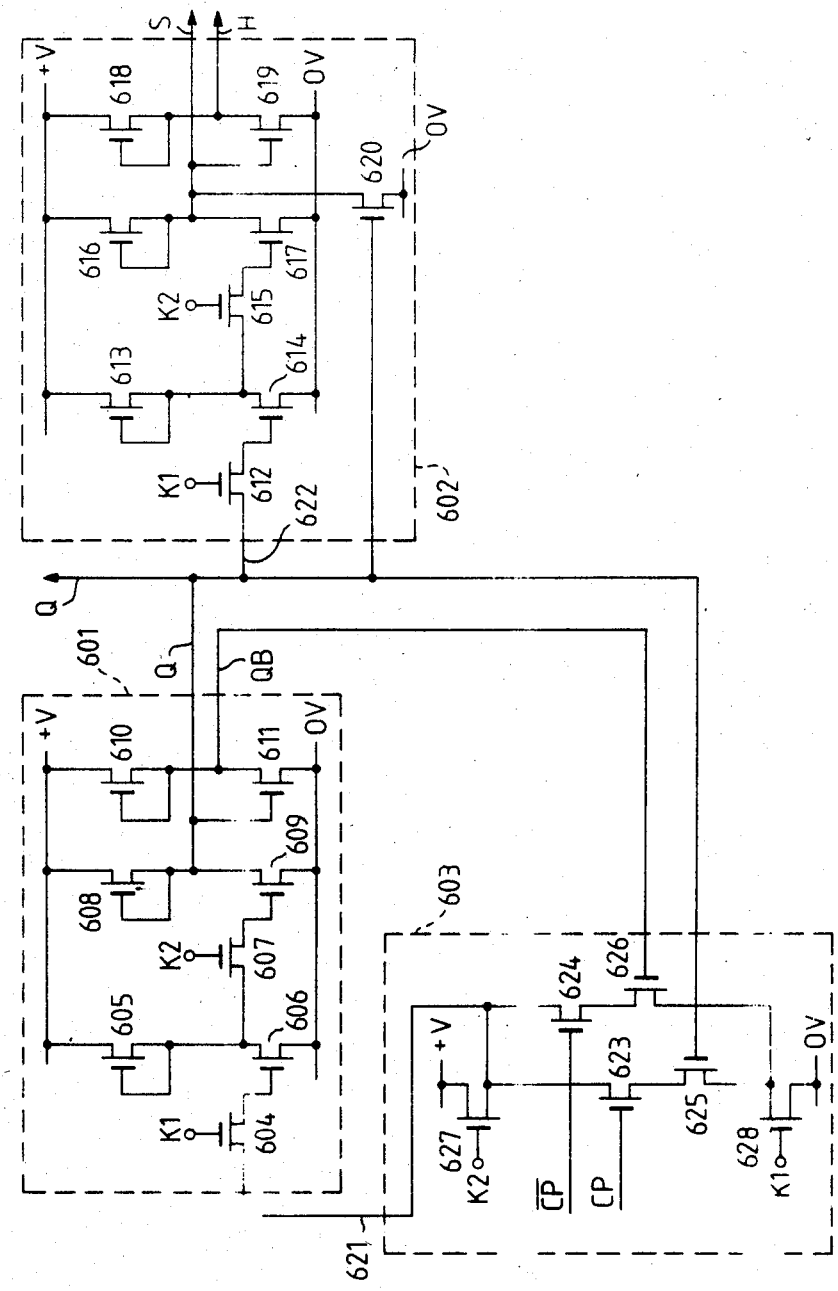
FIG. 6 is a circuit of a circuit arrangement according to the invention.

Referring now to FIG. 6, a circuit arrangement according to the invention there shown comprises two flip-flop circuits 601 and 602, and a combinatorial logic circuit 603. The flip-flop circuit 601 comprises transistors 604 to 611 and is identical to the flip-flop circuit shown in FIG. 1. The flip-flop circuit 602 comprises transistors 612 to 619 and in this respect it is also identical to the flip-flop circuit shown in FIG. 1. However, the flip-flop circuit 602 also includes an additional transistor 620. The gate capacitances are assumed to be implicit in these flip-flop circuits.

Figure 11:
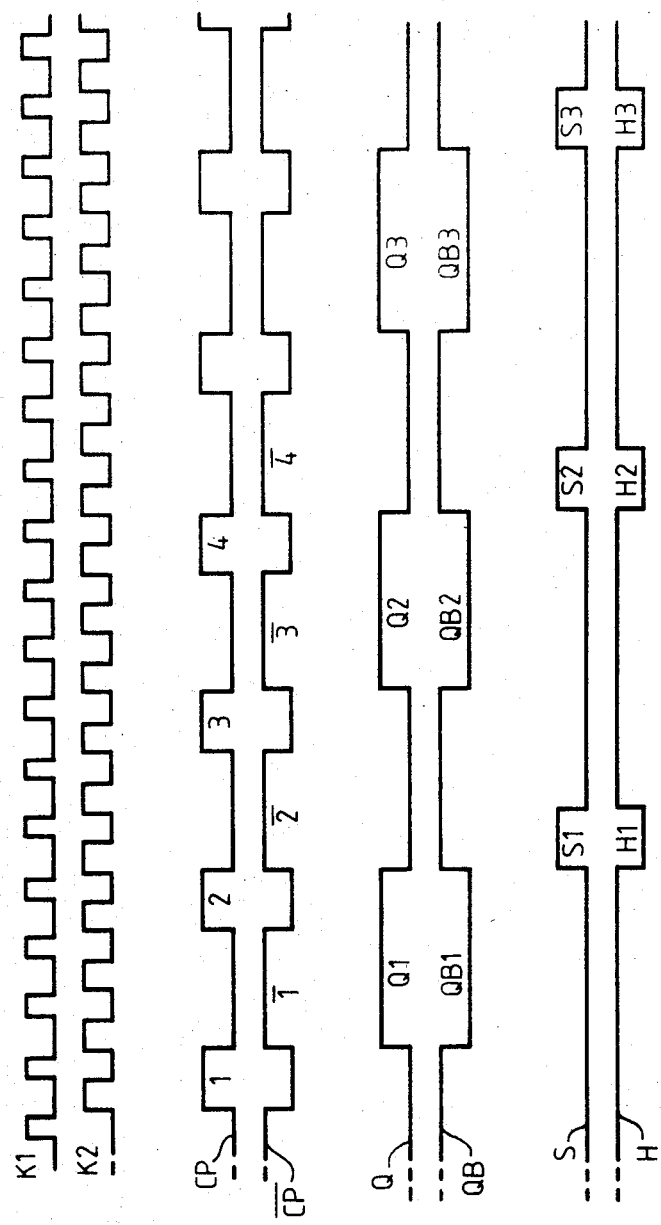

The dynamic synchronous operation of the flip-flop circuits 601 and 602 (ignoring transistor 620) in response to the two clock pulses K1 and K2 and independence on the logic level of a data waveform applied to their respective input leads 621 and 622 is the same as that already described for the flip-flop circuit shown in FIG. 1 and therefore will not be considered further. The combinatorial logic circuit 603 comprises two gating transistors 627 and 628. The transistors 623 and 624 are controlled by the counter clock pulses CP and $\overline{CP}$, respectively, and the transistors 625 and 626 are controlled, respectively, by the Q- and QB-outputs of the flip-flop circuit 601. The function of the circuit arrangement of FIG. 6 is, in effect, to divide-by-two the clock pulses CP applied to it, while at the same time producing output shift pulses S which have the same duration as the clock pulses CP but only one half their repetition rate. Hold pulses H which are an inverted version of the shift pulses S are also produced. FIG. 11 shows in idealized form the various pulse waveforms for the circuit arrangement of FIG. 6.

In operation, the circut arrangement of FIG. 6 is initially reset such that the QB. and H-outputs are at the high logic level, and the Q- and S-outputs are at the low logic level. This resetting may be effected by including in the combinatorial logic circuit 603 a reset gating transistor which is connected between the drive transistors 627 and 628 and is switched on by a reset pulse applied to its gate. Because the Q-output of the flip-flop circuit 601 provides the input for flip-flop 602, the reset pulse is required to persist for the duration of two successive cycles of the K1 and K2 pulses. The counter clock pulses CP have a mark/space ratio of 1:2 in this example. During the occurrence of the first (after resetting) clock pulse CP1 and when the next pulse K1 occurs, gating transistor 623 is switched on by this clock pulse CPI, but gating transistor 625 remains switched off due to the low logic level of the Q-output. Therefore, a high logic level is applied to the input level 621 of the flip-flop circuit 601. As a result, the Q-output goes to the high logic level and the QB-output goes to the low logic level when the following pulse K2 occurs. As applied to the input lead 622 of the flip-flop circuit 602, the high logic level at the Q-output tends to make the S-output assume the high logic level. However, the high logic level at the Q-output also switches on transistor 620 which thereby maintains the S-output at the low logic level at this time. The Q-output is maintained at the high logic level by the hold action of the clock $\overline{CP}1$, the gating transistor 624 being switched on by the pulse $\overline{CP}1$, but not the gating transistor 626 due to the low Q-output. When the next counter clock pulse CP2 occurs, the input level from the combinatorial logic circuit 603 changes from the high to the low logic level, so that the Q-output changes from the high logic level to the low logic level. When this happens, transistor 620 is no longer switched on and the S-output goes to the high logic level, but only for the period of the next clock pulse K2 and then clock pulse K1 following which, transistor 617 is switched on when the next again clock pulse K2 occurs, so that the S-output assumes the low logic level again. Thus, the arrangement produces one output shift pulse S1 in response to the two counter clock pulses CP1 and CP2. Similarly, the next two counter clock pulses CP3 and CP4 cause the production of the output shift pulse S2, and so on. The circuit arrangement thus effects a divide-by-two action, accompanied by the generation of shift pulses of the same duration as the counter clock pulses, but at one half their repetition rate.

Figure 7:
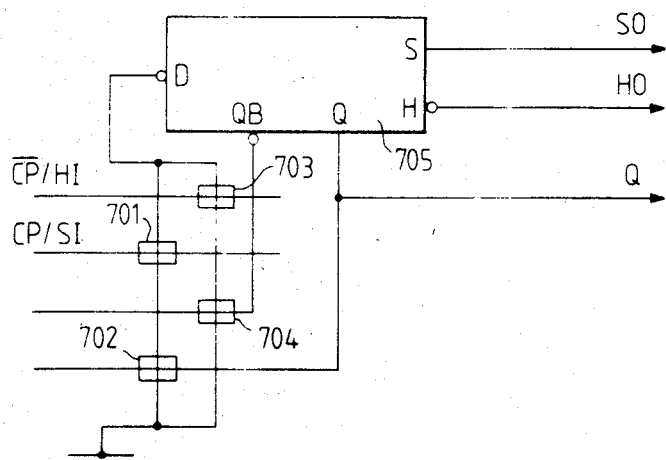
FIG. 7 is a schematic diagram representing the circuit arrangement of FIG. 6.

A suitable schematic diagram for the circuit arrangement of FIG. 6 is shown in FIG. 7. This diagram shows as small rectangles gating transistor gates 701 to 704 which form the combinatorial logic, and a rectangle 705 which represents the two flip-flops. The D-input and the Q- and QB-outputs of the first flip-flop are shown, together with the S- and H-outputs of the second flip-flop. Shift and hold output leads are generally designated SO and HO, and shift and hold input leads (control leads) are generally designated SI and HI.

Figure 8:
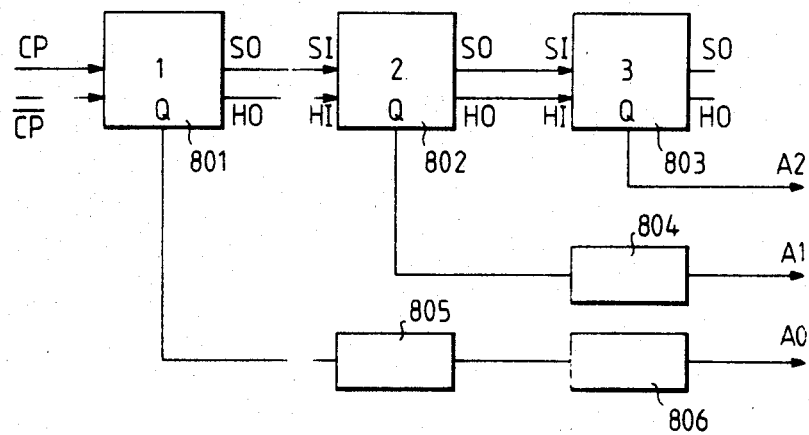
FIG. 8 is a schematic diagram of a 3-stage binary counter comprising three circuit arrangements according to the invention.
Figure 12:
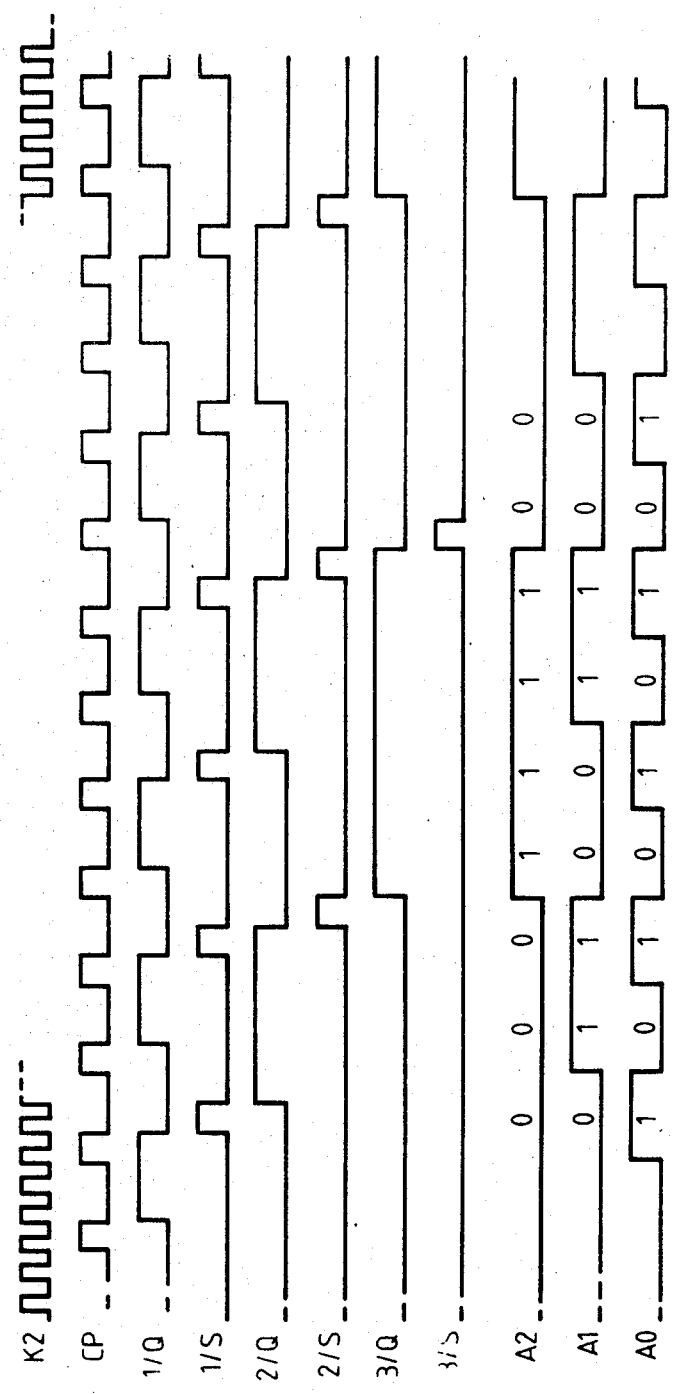

A number of circuit arrangements according to the invention, such as shown in FIG. 6, can be interconnected to form a conventional binary counter which has a natural binary count. An example of a 3-stage conventional binary counter is shown in FIG. 8 and related waveform diagrams in idealized form are shown in FIG. 12. This binary counter comprises three stage 801, 802 and 803, each of which is comprised by a respective circuit arrangement according to the invention. The shift and hold inputs SI and HI of the first stage 801 have the clock pulses CP and $\overline{CP}$ applied to them, respectively. The shift and hold outputs SO and HO of each of the stage 801 and 802 are connected to the shift and hold inputs SI, HI of the immediately following stage. The binary counter thus functions as a so-called "ripple" counter in that the clock pulses CP to be counted are applied only to the first counter stage 801, each counter stage thereafter driving the succeeding stage with its output. However, since each stage "toggles" one clock pulse K2 after the previous stage, it is necessary to equalize the resulting delays in the Q-outputs from the several stages. This is achieved using dynamic shift stages 804, 805 and 806 (one per K2 clock pulse cycle delay), between the Q-outputs and the binary count outputs A0 to A2 of the counter. Each of these dynamic shift stages can be comprised by the flip-flop circuit of FIG. 1, but with the inverter output stage omitted if the QB-output is not needed.

It can be seen from FIG. 12 that the count output A0 is delayed by two cycles of the clock pulse K2 with respect to the output 1/Q and that the count output A1 is delayed by one cycle of the clock pulse K2 with respect to the output 2/Q, these delays being achieved by the shift stages 805 and 806 in the first instance and by the shift stage 804 in the second instance.

When resetting the entire binary counter, a reset pulse must be applied and held for three system clock cycles (K2) to achieve full clearing.

Normally, in dynamic logic circuits such as the flip-flop circuit of FIG. 1, the output is one or two inverter stages away from the transfer and store gate which activates them. In a circuit arrangement according to the invention, the maximum delay is three inverter stages. However, any array logic structure required for the combinatorial logic would be small and it is expected that the configuration will operate at system clock speeds up to at least 2 MHz. The technique can be applied to binary counters having a large number of stages without speed limitation.

It will be apparent that modifications of the circuit arrangement described are possible within the scope of the invention. For instance, an inversion or other variation of the logic levels would be possible. Also, synchronous dynamic circuitry other than the so-called ratioless circuits which have been described may be used. Furthermore, different relationships between the system clock pulses (K1, K2) and the counter or drive clock pulses (CP, $\overline{CP}$) are possible, as are also variations in the mark/space ratios of these pulses. However, it is apparent that one counter clock pulse cycle should have a duration at least twice that of a system clock pulse cycle.

I claim:

1. A dynamically operable two-phase circuit arrangement comprising first and second dynamic switching circuit, each of which has an input stage, a non-inverting output stage and an inverting output stage, each stage being responsive to either one of two possible logic levels at an input to produce the other logic level at an output, the input stage having its input connected to receive an input logic level by a first transfer stage controlled by first drive clock pulses of one phase, the non-inverting output stage having its input connected to receive the output logic level of the input stage by a second transfer stage controlled by second, substantially non-overlapping drive clock pulses of another phase, and the inverting output stage having its input connected to receive the output logic level of the non-inverting output stage, which circuit arrangement further comprises a combinatorial logic circuit which is operable under two-phase control by said first and second drive clock pulses and in response to applied counter clock pulses to cause the first dynamic switching circuit to perform a divide-by-two operation, and which circuit arrangement is characterized in that one of the output stages of the first dynamic switching circuit has its output connected to the input of the input stage of the second dynamic switching circuit and by a switching stage to the output of the corresponding output stage of the second dynamic switching circuit, the arrangement being such that at said latter output shift pulses having only one half the repetition frequency of the counter clock pulses are produced.

2. A circuit arrangement as claimed in claim 1, characterized in that said switching stage is responsive to either one of said two possible logic levels at an input to produce the other logic level at an output, with said switching stage having its input connected to receive the prevailing logic level at the output of said one output stage of the first dynamic switching circuit and having its output connected to the output of the corresponding output stage of the second dynamic switching circuit to perform therewith an OR-function which determines the duration of said shift pulses.

3. A circuit arrangement as claimed in claim 1 or claim 2, characterized in that said combinatorial logic circuit comprises two 2-input AND-gates, the outputs of which form respective inputs of a 2-input OR-gate, one of said AND-gates having one input connected to receive the applied counter clock pulses and other input connected to the output of the inverting output stage of the first flip-flop circuit, and the other of said AND-gates having one input connected to receive an inverted form of the applied counter clock pulses, and the other input connected to the output of the non-inverting output stage of the dynamic switching circuit.

4. A circuit arrangement as claimed in claim 1 or claim 2, implemented as an integrated circuit in which the combinatorial logic circuit is formed as an array logic structure comprising a plurality of controllable insulated gate field effect transistors which are formed at selected intersections of an array comprising a plurality of rows of series-connected gate regions and a plurality of columns of surface regions which at each selected intersection define source and drain regions for the transistor which is formed there, an electrical conductive path being formed at each non-selected intersection, at least in operation, to effectively short circuit the intersection with respect to the relevant surface region column.

5. A plurality of dynamically operable two-phase circuit arrangements each according to claim 1 or claim 2, interconnected fo form respective stages of a conventional binary counter having a natural binary count, the outputs of said dynamic switching circuits forming the output of said counter, in which counter the circuit arrangement forming the first state has its combinatorial logic circuit connected to receive applied counter clock pulses and the circuit arrangement forming each other stage has its combinatorial logic circuit connected to receive the shift pulses produced by the circuit arrangement forming the preceding stage.

6. A plurality of circuit arrangement as claimed in claim 5, characterized in that the binary count is taken from the output of the non-inverting state of the first dynamic switching circuit in each circuit arrangement, and in that for an n-stage counter, (n-1), (n-2), . . . (n-n) delay stages for delay equalization are provided for the 1 to n counter stages, respectively, the delay state(s) being connected to the relevant non-inverting output stage of the circuit arrantement concerned and (each) providing a delay corresponding to one cycle of two-phase dynamic operation of the circuit arrangement.

* * * * *